United States Patent
Kim et al.

(10) Patent No.: US 9,236,403 B2
(45) Date of Patent: Jan. 12, 2016

(54) DISPLAY APPARATUS HAVING LOW REFLECTION POLYMER LAYER

(71) Applicant: Samsung Display Co., Ltd., Yongin, Gyeonggi-Do (KR)

(72) Inventors: Kyungseop Kim, Hwaseong-si (KR); Joonyong Park, Gunpo-si (KR); Byeong-Beom Kim, Asan-si (KR); Sangwon Shin, Yongin-si (KR); Changoh Jeong, Suwon-si (KR); Honglong Ning, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/099,972

(22) Filed: Dec. 8, 2013

(65) Prior Publication Data

US 2015/0014709 A1    Jan. 15, 2015

(30) Foreign Application Priority Data

Jul. 9, 2013    (KR) .......................... 10-2013-0080439

(51) Int. Cl.
*H01L 29/18* (2006.01)
*H01L 27/12* (2006.01)

(52) U.S. Cl.
CPC .................................. *H01L 27/124* (2013.01)

(58) Field of Classification Search
USPC ................ 257/88, E21.409, E33.053; 438/34
See application file for complete search history.

(56) References Cited

U.S. PATENT DOCUMENTS

| | | | |
|---|---|---|---|
| 2002/0051105 A1* | 5/2002 | Yoon | 349/106 |
| 2008/0220570 A1* | 9/2008 | Ohnuma et al. | 438/166 |
| 2009/0046233 A1* | 2/2009 | Cho et al. | 349/141 |
| 2011/0156995 A1 | 6/2011 | Choi et al. | |
| 2012/0043580 A1 | 2/2012 | Yamazaki et al. | |
| 2012/0287080 A1 | 11/2012 | Akimoto | |
| 2014/0021518 A1* | 1/2014 | Han et al. | 257/290 |

FOREIGN PATENT DOCUMENTS

JP    11-052364 A    2/1999

* cited by examiner

*Primary Examiner* — Matthew Gordon
(74) *Attorney, Agent, or Firm* — Cantor Colburn LLP

(57) ABSTRACT

A display apparatus includes a first insulating substrate including a front surface that provides an image and a rear surface opposite to the front surface, a low reflection layer provided on the rear surface, a gate wiring part provided on the low reflection layer, a data wiring part provided on the rear surface, the data wiring part that is insulated from the gate wiring part; and a pixel which is connected to the data wiring part and displays the image, where the low reflection layer includes a polymer resin having a black color.

14 Claims, 13 Drawing Sheets

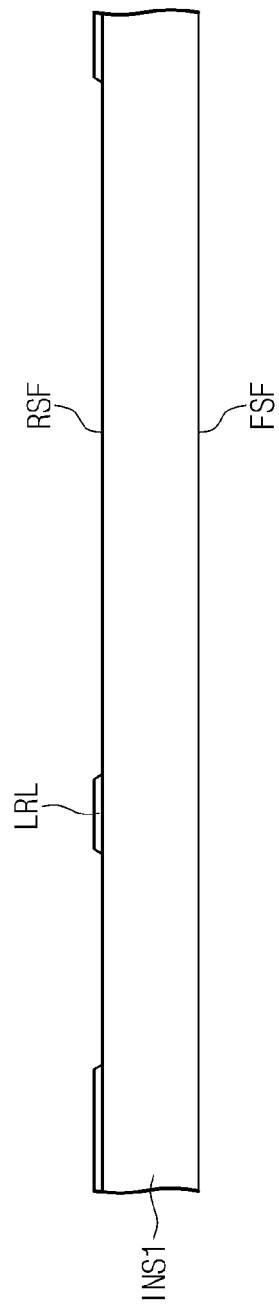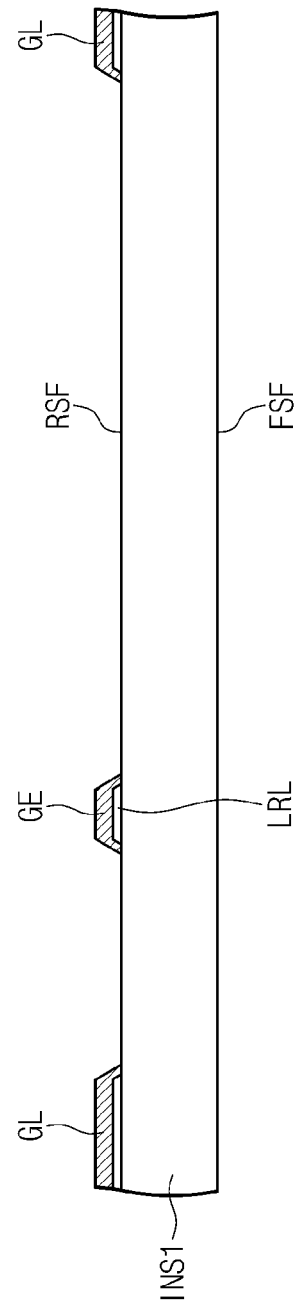

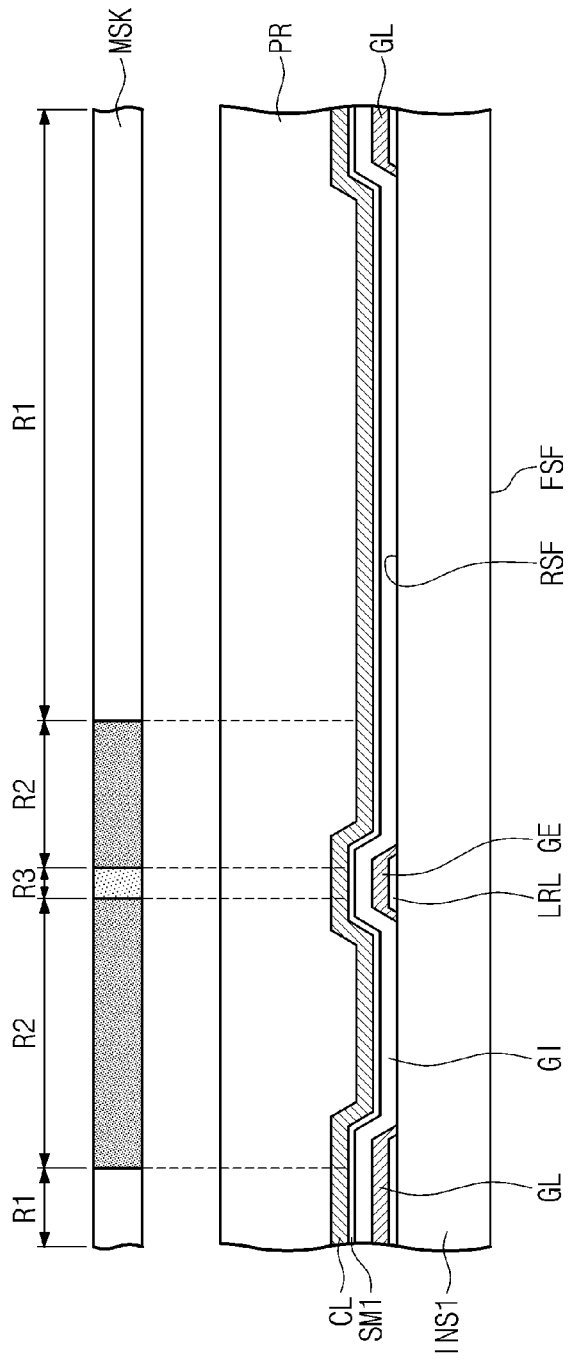
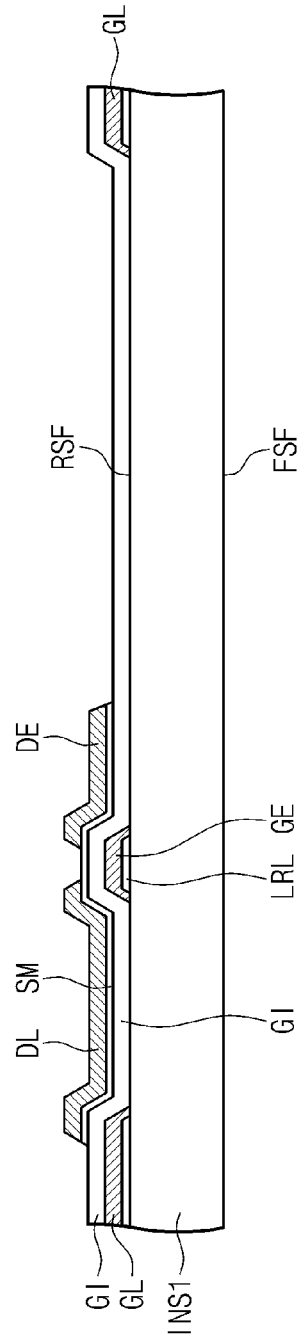
Fig. 8A
Fig. 8B

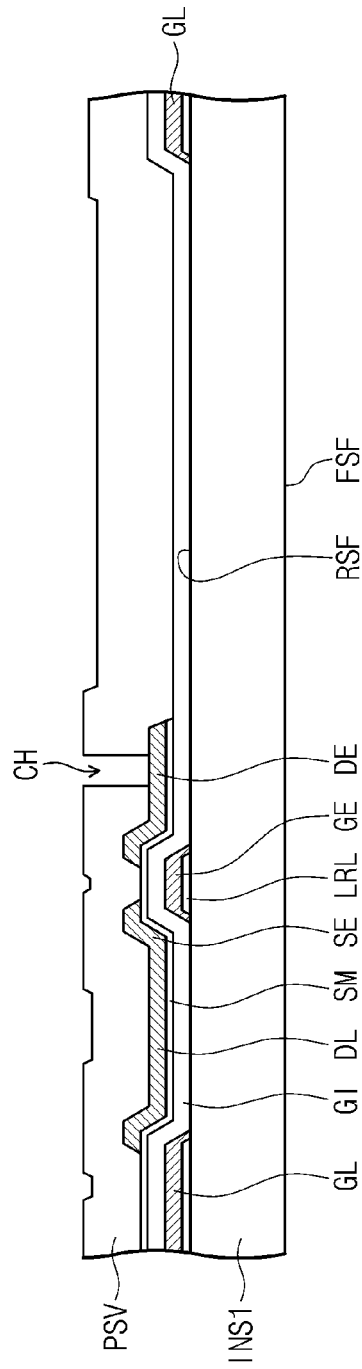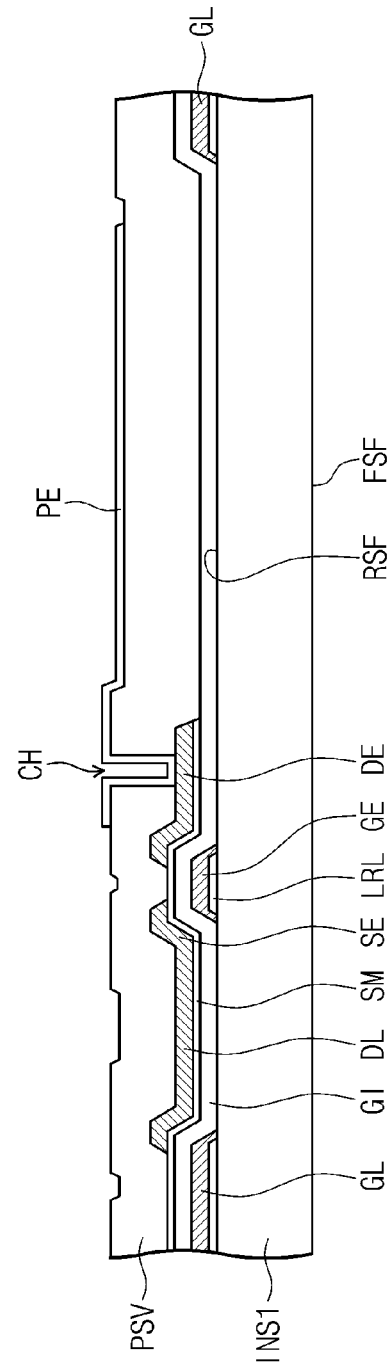

DISPLAY APPARATUS HAVING LOW REFLECTION POLYMER LAYER

This application claims priority to Korean Patent Application No. 10-2013-0080439, filed on Jul. 9, 2013, and all the benefits accruing therefrom under 35 U.S.C. §119, the entire contents of which are hereby incorporated by reference in their entirety.

BACKGROUND

1. Field

The invention relates to a display apparatus and a method of manufacturing the same, and more particularly, to a display device having improved display quality and a method of manufacturing the same.

2. Description of the Related Art

A display apparatus including a display panel not inherently emitting light such as a liquid crystal display apparatus, for example, includes a backlight assembly as a constituting element, and the display panel displays an image by using light generated from the backlight assembly.

The display panel includes a lower substrate on which a plurality of thin film transistors is disposed, an upper substrate provided on the lower substrate and a liquid crystal layer disposed between the lower substrate and the upper substrate. The backlight assembly is provided under the lower substrate.

SUMMARY

The invention provides a display apparatus having improved display quality and a method of manufacturing the same.

Exemplary embodiments of the invention provide a display apparatus including a first insulating substrate including a front surface providing an image and a rear surface opposite to the front surface, a low reflection layer provided on the rear surface, a gate wiring part provided on the low reflection layer, a data wiring part provided on the rear surface and insulated from the gate wiring part and a pixel connected to the data wiring part and displaying the image. The low reflection layer includes a polymer resin having a black color.

The low reflection layer may be provided at a same position with a same shape as the gate wiring part from a plan view, and a width of the low reflection layer may be equal to or smaller than a width of the gate wiring part.

The gate wiring part may include a gate line extended in a first direction and a gate electrode connected to the gate line, and the data wiring part may include a data line extended in a second direction different from the first direction, a source electrode connected to the data line and a drain electrode separated from the source electrode.

The gate wiring part may include a single layer or a multi-layer. When the gate wiring part includes the single layer, the gate wiring part may include one of copper, titanium, molybdenum, chromium, gold, silver and an alloy including at least one of copper, titanium, molybdenum, chromium, gold and silver. When the gate wiring part includes a multi-layer, the gate wiring part may include first to third metal layers obtained by stacking different materials on the rear surface one by one. In accordance with an exemplary embodiment of the invention, the first metal layer may include Ti, the second metal layer may include one of gallium zinc oxide ("GZO"), zinc indium oxide ("ZIO") and TiO, and the third metal layer may include copper (Cu).

In accordance with an exemplary embodiment of the invention, a planarization layer may be further included between the gate wiring part and the low reflection layer.

In accordance with an exemplary embodiment of the invention, the low reflection layer having the black color may include a mixture of a hydrocarbon and a siloxane.

According to an exemplary embodiment of the invention, a method of manufacturing a display device includes disposing a low reflection layer on the first insulating substrate, disposing a gate wiring part on the low reflection layer, disposing an insulating layer on the gate wiring part, disposing a data wiring part on the insulating layer, providing a pixel connected to the data wiring part, and disposing a backlight unit facing the first insulating substrate where the pixel is disposed between the backlight unit and the first insulating substrate.

The disposing the low reflection layer may include coating a photosensitive polymer resin composition, exposing the photosensitive polymer resin composition and developing the photosensitive polymer resin composition to dispose the low reflection layer.

The disposing the gate wiring part may include disposing a conductive layer on the low reflection layer, disposing photoresist on the conductive layer, exposing and developing the photoresist to provide a photoresist pattern, and etching the conductive layer by using the photoresist pattern as a mask to provide the gate wiring part.

The method of manufacturing the display apparatus in accordance with an exemplary embodiment of the invention, disposing a planarization layer between the low reflection layer and the gate wiring part may be further included.

According to an exemplary embodiment of the invention, a tape carrier package is stably disposed and adhered in a display apparatus, and deterioration of a thin film transistor due to heat may be effectively decreased. In addition, the reflection due to external light in a display panel may be effectively decreased, and a contrast ratio may be increased.

BRIEF DESCRIPTION OF THE DRAWINGS

The above and other, advantages and features of this disclosure will become more apparent by describing in further detail exemplary embodiments thereof with reference to the accompanying drawings, in which:

FIGS. 6A and 6B are cross-sectional views taken along line II-II' in FIG. 5;

FIGS. 8A and 8B are cross-sectional views taken along line II-II' in FIG. 7;

FIGS. 10A and 10B are cross-sectional views taken along line II-II' in FIG. 9;

DETAILED DESCRIPTION

Figure 1:
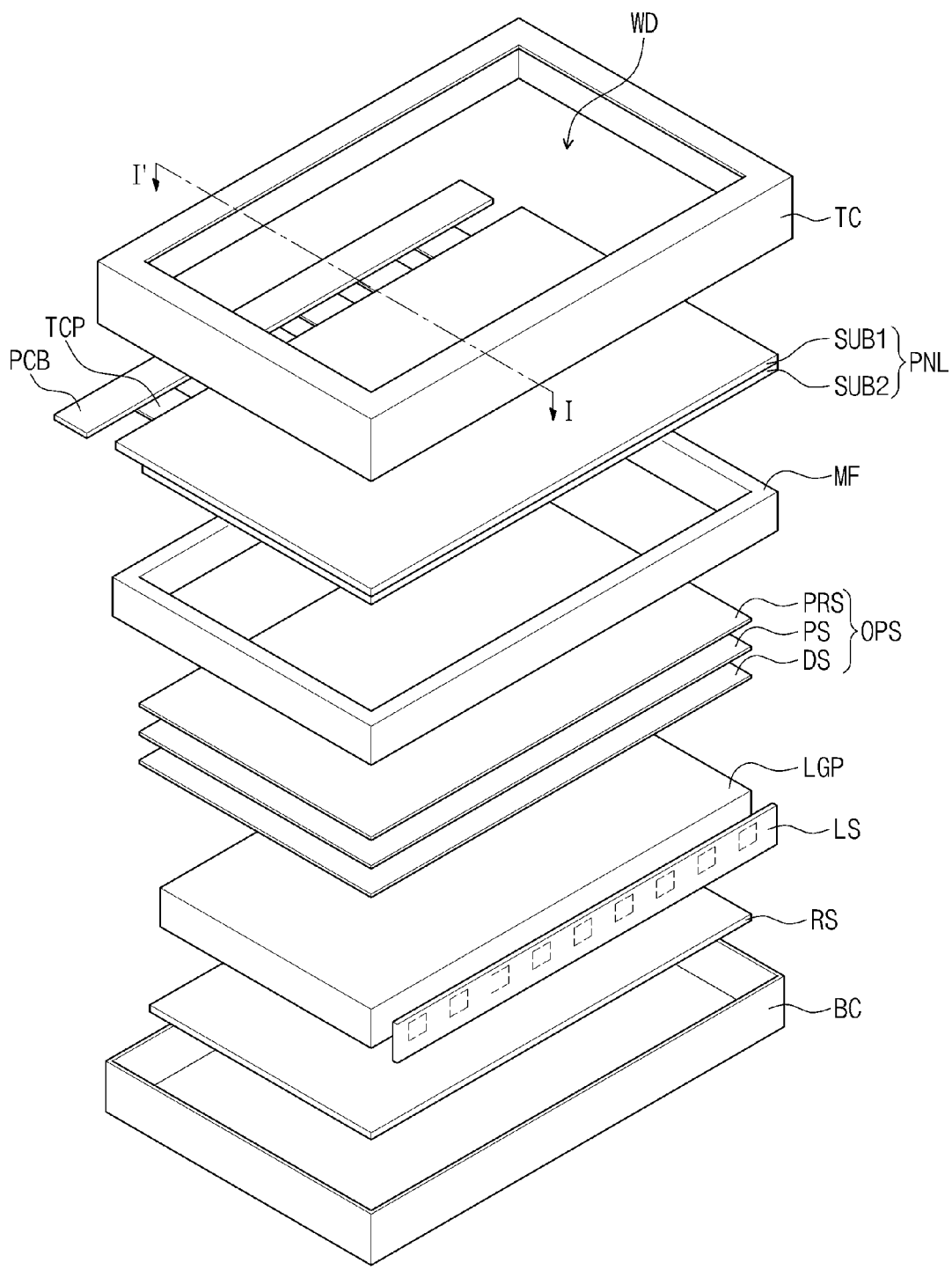
FIG. 1 is an exploded perspective view illustrating an exemplary embodiment of a display apparatus in accordance with the invention.

When driving a display panel for a long time, thin film transistors may be continuously exposed to the light from a backlight assembly and may be deteriorated. Therefore, there remains a need for an improved display panel and/or thin film transistor which reduces or effectively prevents deterioration of the thin film transistors.

Exemplary embodiments of the invention will be described below in more detail with reference to the accompanying drawings. The invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art.

In the drawings, analogous reference numerals are used for analogous elements. The dimensions of layers and regions are exaggerated for clarity of illustration. It will be understood that, although the terms first, second, etc. may be used herein to describe various elements, these elements should not be limited by these terms. These terms are only used to distinguish one element from another element. Thus, a first element discussed below could be termed a second element, and a second element discussed below could be termed a first element without departing from the teachings of the invention. As used herein, the singular forms are intended to include the plural forms as well, unless the context clearly indicates otherwise.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

It will be further understood that the terms "comprises" and/or "comprising," when used in this specification, specify the presence of stated features, numerals, steps, operations, components, parts or combinations thereof, but do not preclude the presence or addition of one or more other features, numerals, steps, operations, components, parts or combinations thereof.

It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout. For convenience of explanation, a direction in a place where a user is and an image is displayed is regarded as "upper direction" or "front direction," and an opposite direction is regarded as "lower direction" or "rear direction."

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments of the invention will be described in detail with reference to the accompanying drawings.

Figure 2:
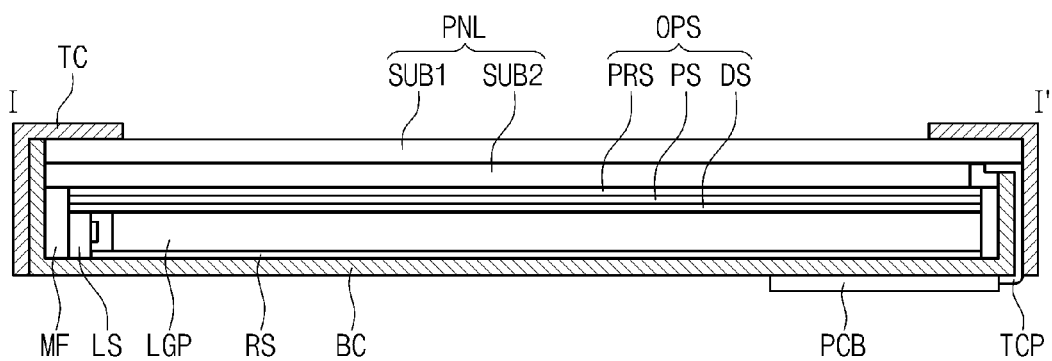
FIG. 2 is a cross-sectional view taken along line I-I' in FIG. 1.

FIG. 1 is an exploded perspective view illustrating a display apparatus in accordance with an exemplary embodiment of the invention. FIG. 2 is a cross-sectional view taken along line I-I' in FIG. 1.

Referring to FIGS. 1 and 2, the display apparatus includes a display panel PNL, a backlight unit and a top chassis TC.

The display panel PNL displays an image. In an exemplary embodiment, the display panel PNL may include a liquid crystal display panel, an electrowetting display panel, an electrophoretic display panel, for example. In an exemplary embodiment, explanation will be given with respect to the liquid crystal display panel among the display panels. However, the invention is not limited thereto, and the explanation can be also applied to other display panels unless specific mention is given or unless incompatible.

The display panel PNL may be provided as a tetragonal plate-like shape having two pairs of parallel sides. In an exemplary embodiment, the display panel PNL may be a rectangle having a pair of long sides and a pair of short sides. The display panel PNL may include a first substrate SUB1, a second substrate SUB2 facing the first substrate SUB1 and a liquid crystal layer (not illustrated) disposed between the first substrate SUB1 and the second substrate SUB2. In this case, the first substrate SUB1 may have a greater area than an area of the second substrate SUB2, and one side of the first substrate SUB1 may not be overlapped by the second substrate SUB2.

In accordance with an exemplary embodiment of the invention, the first substrate SUB1 may include a plurality of pixel electrodes (not illustrated) and a plurality of electrically connected thin film transistors (not illustrated) respectively corresponds to the plurality of pixel electrodes. Each of the plurality of thin film transistors may switch a driving signal provided to the respective pixel electrode. In addition, the second substrate SUB2 may include a common electrode (not illustrated) generating an electric field for controlling an alignment of liquid crystals along with the pixel electrodes. The display panel PNL may drive the liquid crystal layer to display an image in a front direction toward a user.

The display panel PNL may be provided with a tape carrier package TCP and a printed circuit board PCB electrically connected to the display panel PNL through the tape carrier package TCP. A driving circuit such as a drive integrated circuit ("IC"), and the like may be disposed (e.g., installed) on the tape carrier package TCP.

In the display panel PNL, the tape carrier package TCP may be provided (e.g., attached) to one side of the first substrate SUB1, to which the second substrate SUB2 is not provided. In an exemplarily embodiment, a size of the first substrate SUB1 is greater than that of a second substrate SUB2 so that a vacant space may be provided under the first substrate SUB1, in which the second substrate SUB2 is not provided. In the vacant space, the tape carrier package TCP may be stably disposed. In FIG. 1, the printed circuit board PCB is illustrated on the same plane with that of the display panel PNL for convenience of explanation. However, the printed circuit board PCB may be provided on an outer surface of a bottom chassis BC as illustrated in FIG. 2. In this case, the tape carrier package TCP may be bent along the outer surface of the bottom chassis BC to connect the display panel PNL and the printed circuit board PCB.

The backlight unit is provided under the display panel PNL to provide light to the display panel PNL. The backlight unit may include a mold frame MF supporting the display panel PNL, a light source LS emitting light, a light guide plate LGP guiding the light, optical sheets OPS provided on the light guide plate LGP, reflection sheets RS provided under the light guiding plate LGP and the bottom chassis BC provided under the reflection sheet RS.

The mold frame MF may be provided along the edge portion of the display panel PNL to support the display panel PNL from the bottom portion of the display panel PNL. The mold frame MF may include other elements besides the display panel PNL, for example, a fixing member such as a stumbling sill (not illustrated) for fixing or supporting the light source LS, the optical sheets OPS, for example. The mold frame MF may be provided at a position corresponding to the four sides of the display panel PNL or at least a portion of the four sides of the display panel PNL. In an exemplary embodiment, the mold frame MF may have a rectangular ring shape corresponding to the four sides, for example. Alternatively, the mold frame MF may correspond to three sides of the edge portions of the display panel PNL. The mold frame MF may be provided as an inseparable body, or may be obtained by assembling a plurality of frames when necessary. In an exemplary embodiment, the mold frame MF may be provided by using an organic material such as a polymer resin. However, the material is not limited thereto, and any other materials having the same shape and the same function may be used.

The light source LS may be various light sources such as a point light source, a linear light source or a surface light source, but is not limited thereto.

The light guide plate LGP provided between the light source LS and the display panel PNL, guides light from the light source LS to the display panel PNL.

The optical sheet OPS may be provided between the light guide plate LGP and the display panel PNL. The optical sheet OPS may control the light from the light source. The optical sheet OPS may include a diffusion sheet DS stacked on the light guide plate LGP, a prism sheet PS and a passivation sheet PRS.

The reflection sheet RS may reflect light not provided toward the display panel PNL but leaked, to change a passage of the leaked light toward the display panel PNL.

A top chassis TC is provided on the display panel PNL. The top chassis TC may support a front edge portion of the display panel PNL and may cover a side portion of the mold frame MF or a side portion of the bottom chassis BC. In the top chassis TC, a display window WD for exposing a portion for displaying an image in the display panel PNL may be provided.

The bottom chassis BC may be provided under the reflection sheet RS and may receive the display panel PNL, the mold frame MF, the light source LS, the light guide plate LGP, the optical sheets OPS and the reflection sheet RS.

Figure 3:
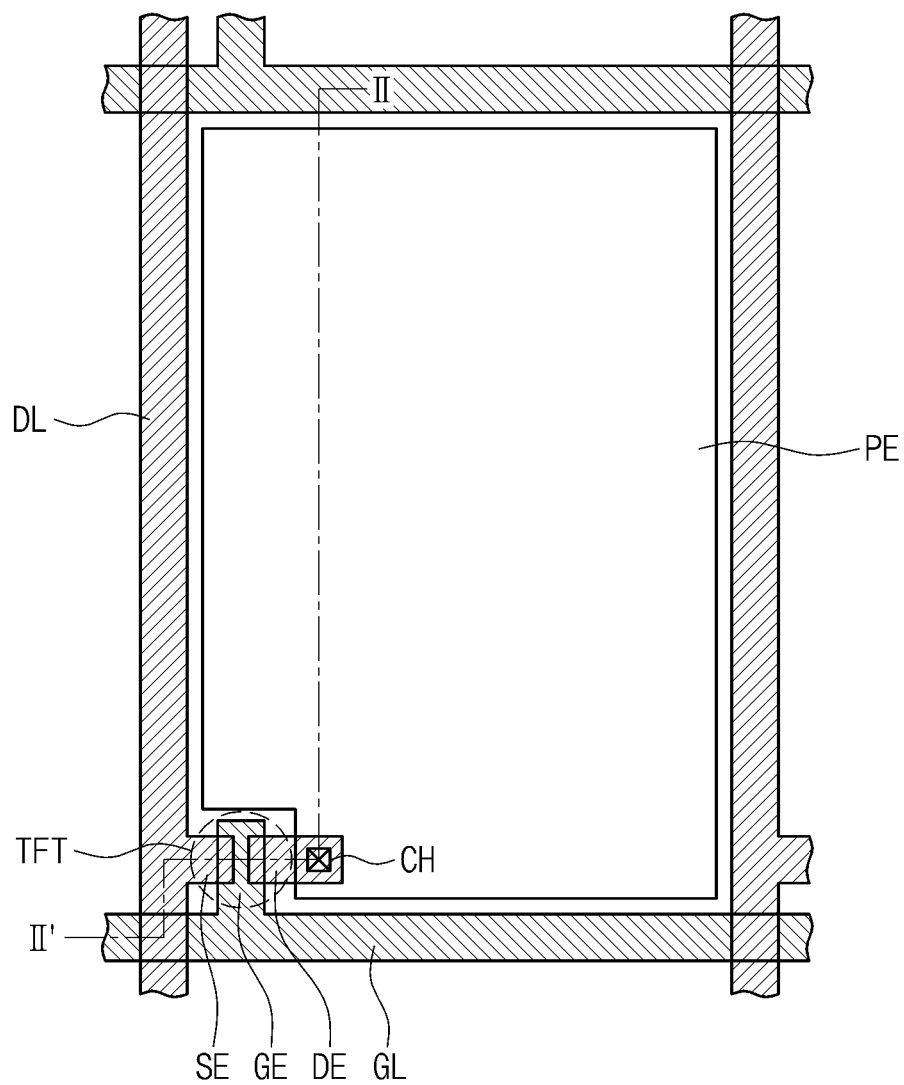
FIG. 3 is a plan view of an exemplary embodiment of a display panel PNL in accordance with the invention.
Figure 4:
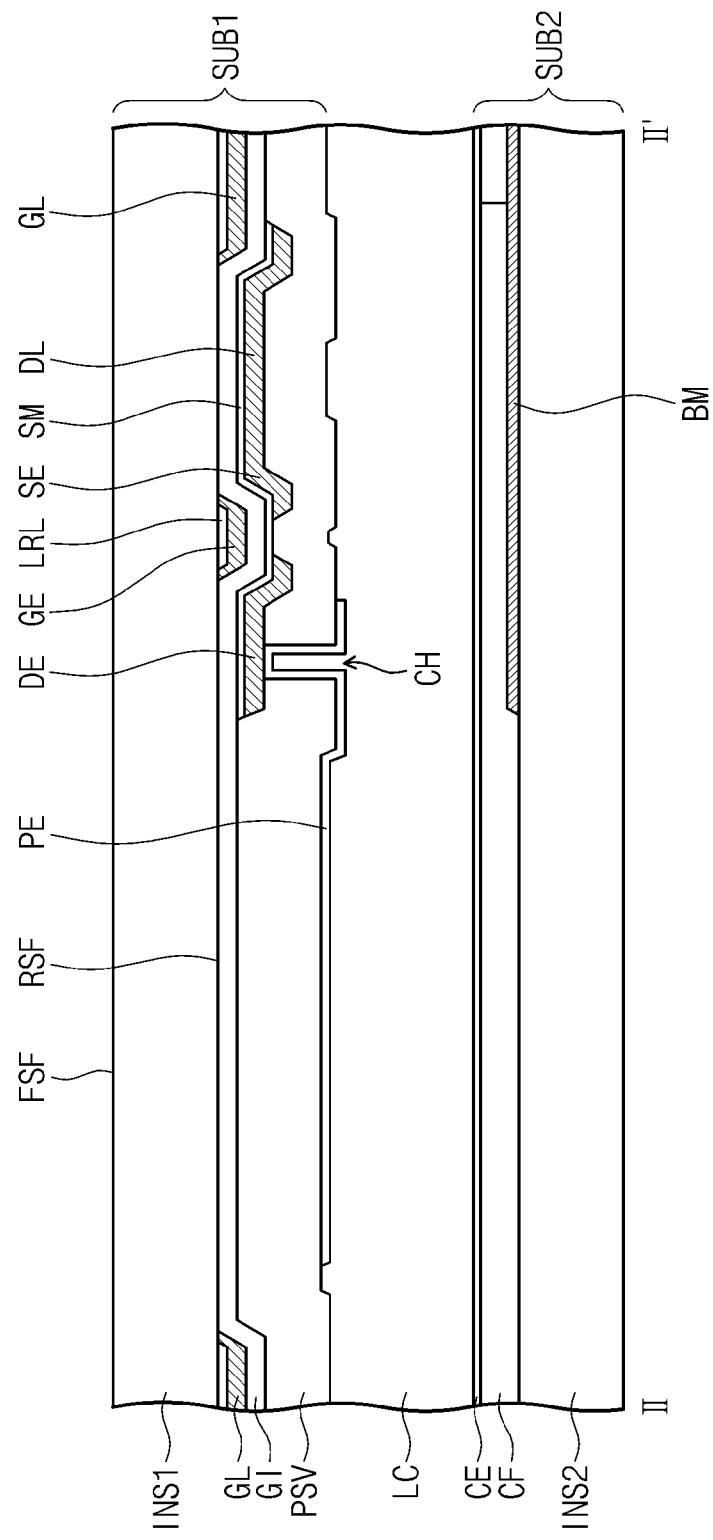
FIG. 4 is a cross-sectional view taken along line II-II' in FIG. 3.

FIG. 3 is a plan view of a display panel PNL in accordance with an exemplary embodiment of the invention. FIG. 4 is a cross-sectional view taken along line II-II' in FIG. 3. The display panel in accordance with an exemplary embodiment of the invention may include a plurality of pixels. Since each of the plurality of pixels has the same structure, only one pixel is illustrated along with adjacent gate lines and data lines adjacent to the one pixel for convenience of explanation.

Referring to FIGS. 3 and 4, the display apparatus in accordance with an exemplary embodiment of the invention may include a first substrate SUB1, a second substrate SUB2 and a liquid crystal layer LC provided between the first substrate SUB1 and the second substrate SUB2.

The first substrate SUB1 includes a first insulating substrate INS1, a low reflection layer LRL, a gate wiring part, a data wiring part and a pixel electrode PE.

The first insulating substrate INS1 may be provided as a transparent insulating substrate, and may include a front surface FSF for displaying an image and a rear surface RSF opposite to the front surface FSF. The front surface FSF faces a user.

The low reflection layer LRL may be provided on the rear surface RSF and may include a polymer resin. The low reflection layer LRL is provided for absorbing light from exterior to the front surface FSF of the first insulating substrate INS1, and may be provided in a region for disposing a gate wiring part to be described herein below. The low reflection layer LRL may illustrate a color that can efficiently absorb the light such as a black color, for example.

In accordance with an exemplary embodiment of the invention, the low reflection layer LRL may include a polymer resin having the black color. In accordance with another exemplary embodiment, the low reflection layer LRL may include a mixture of a hydrocarbon and a siloxane.

The polymer resin may be provided by exposing and developing a photosensitive resin composition.

A buffer layer provided by using an inorganic insulating layer may be provided between the low reflection layer LRL and the first insulating substrate INS1, even though not illustrated. The buffer layer may increase the adhesiveness between the low reflection layer LRL and the first insulating substrate INS1 and may effectively prevent the diffusion of impurities from the first insulating substrate INS1 to the wiring parts and the thin film transistors.

The gate wiring part may be provided on the first insulating substrate INS1. The gate wiring part may include a gate line GL to transmit a first signal and extended in one direction and a gate electrode GE connected to the gate line GL. However, the gate wiring part may not be limited thereto. In an exemplary embodiment, the gate wiring part may further include a storage line (not illustrated), for example.

Particularly, the gate wiring part may be provided on the low reflection layer LRL overlapped with the low reflection layer LRL. The gate wiring part may have the same shape at the same position as the low reflection layer LRL when viewed from a plan view. In accordance with an exemplary embodiment of the invention, the gate wiring part may be provided to have the same size (the same width or the same area) as that of the low reflection layer LRL, and may be provided to completely cover the low reflection layer LRL. When the gate wiring part has the same width as the width of the low reflection layer LRL, the gate wiring part may cover only the upper surface of the low reflection layer LRL. In addition, when the gate wiring part has a greater width than the width of the low reflection layer LRL, the gate wiring part may cover both a side portion and an upper portion of the low reflection layer LRL.

In an exemplary embodiment, the gate wiring part may be provided as a single layer including a conductive material. The conductive material may be one of copper, titanium, molybdenum, chromium, gold, silver, or an alloy including at least one of them.

The material included in the gate wiring part may have a better adhesiveness than that of the polymer resin included in the low reflection layer LRL with respect to the first insulating substrate INS1 (or the buffer layer). Thus, the gate wiring part may be provided to make a direct contact with the first insulating substrate INS1 (or the buffer layer) so that the polymer resin may not be detached from the first insulating substrate INS1 in accordance with an exemplary embodiment.

On the gate wiring part, a gate insulating layer GI is provided.

The data wiring part may be provided on the first insulating substrate INS1 so as to be insulated from the gate wiring part while interposing the gate insulating layer GI therebetween. The data wiring part transmits a second signal in response to the first signal, and may include a data line DL extended in a different direction from the gate line GL, a source electrode SE connected to the data line DL and a drain electrode DE separated from the source electrode SE. However, the data wiring part is not limited thereto. In an exemplary embodiment, the data wiring part may further include a power source line (not illustrated) in accordance with another exemplary embodiment of the invention, for example.

A semiconductor pattern SM overlapping the gate electrode GE is provided between the gate insulating layer GI and the data wiring part. The semiconductor pattern SM overlaps a portion of the source electrode SE and a portion of the drain electrode DE to provide a channel between the source electrode SE and the drain electrode DE.

The gate electrode GE, the semiconductor pattern SM, the source electrode SE and the drain electrode DE constitute a thin film transistor TFT.

On the data wiring part, a passivation layer PSV is provided. The passivation layer PSV covers the gate line GL, the data line DL, the source electrode SE and the drain electrode DE, and is provided on the first insulating substrate INS1. A contact hole CH is defined in the passivation layer PSV and exposes a portion of the drain electrode DE.

The pixel electrode PE is connected to the drain electrode DE through the contact hole CH. The pixel electrode PE receives the second signal to charge a pixel voltage.

The second substrate SUB2 includes a second insulating substrate INK, a black matrix BM, a color filter layer CF and a common electrode CE.

The first insulating substrate INS1 faces the first insulating substrate INS1. The black matrix BM is provided on the second insulating substrate INK to block light transmitting the liquid crystal layer LC.

The color filter layer CF is provided to accomplish colors such as red, green and blue, for example. The color filter layer CF covers the black matrix BM, and is provided on the second insulating substrate INK.

The common electrode CE is provided on the color filter layer CF. The common electrode CE generates an electric field along with the pixel electrode PE for driving the liquid crystal layer LC.

In accordance with an exemplary embodiment of the invention, the common electrode CE is provided on the second insulating substrate INS2, however is not limited thereto. In accordance with another example embodiment, the common electrode CE may be provided on the first insulating substrate INS1 to be insulated from the pixel electrode PE, for example.

The liquid crystal layer LC is driven by the electric field and displays an image. The liquid crystal layer LC as an image display layer, may be replaced with an electrophoretic layer or an electrowetting layer in an electrophoretic display apparatus or an electrowetting display apparatus. The image display layer may be any layer that may be driven by an electrode(s) connected to the thin film transistor and may display an image without limitation. In an exemplary embodiment, the image display layer may be micro shutter using microelectromechanical systems ("MEMS"), for example.

The pixel electrode PE, the common electrode CE and the liquid crystal layer LC constitute a pixel, but the invention is not limited thereto.

Even though not illustrated in the drawings, a backlight unit providing light to the liquid crystal layer LC of the display panel PNL may be provided under the display panel PNL (see FIG. 1). The backlight unit may be provided to face the first insulating substrate INS1 with placing the second insulating substrate INS2 therebetween.

In the illustrated exemplary embodiment, when the thin film transistor TFT is turned-on in response to the first signal provided through the gate line GL, the second signal provided through the data line DL may be provided to the pixel electrode PE through the turned-on thin film transistor TFT. Thus, an electric field may be disposed between the pixel electrode PE and the common electrode CE into which a common voltage is applied. Liquid crystal molecules in the liquid crystal layer LC may be driven according to the electric field, and an image may be displayed according to an amount of light passing through the liquid crystal layer LC.

In the illustrated exemplary embodiment, the display apparatus may be manufactured by disposing a low reflection layer LRL on a first insulating substrate INS1, disposing a gate wiring part on the low reflection layer LRL, disposing a gate insulating layer GI on the gate wiring part, disposing a data wiring part on the gate insulating layer GI, providing a pixel connected to the data wiring part, and disposing a backlight unit facing the first insulating substrate INS1 with placing the pixel therebetween.

In accordance with an exemplary embodiment of the invention, a method of manufacturing the display apparatus will be explained referring to attached drawings.

Figure 5:
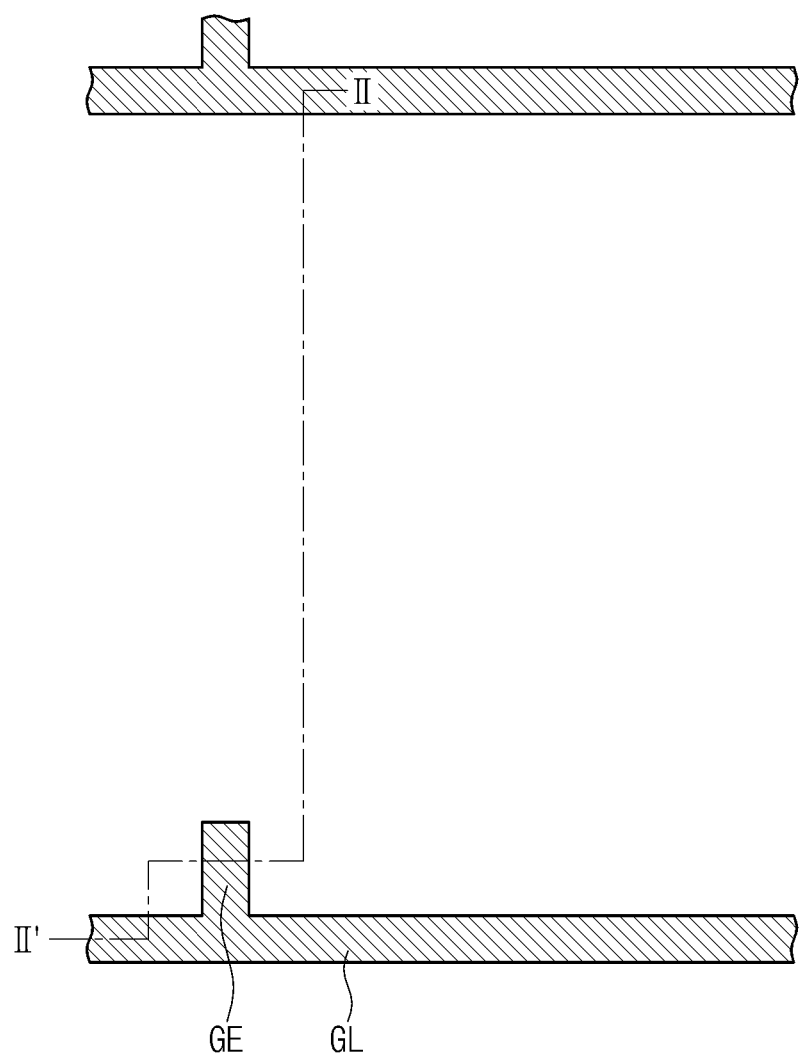
FIGS. 5, 7 and 9 are plan views subsequently illustrating an exemplary embodiment of a method of manufacturing a display apparatus in accordance with the invention.
Figure 7:
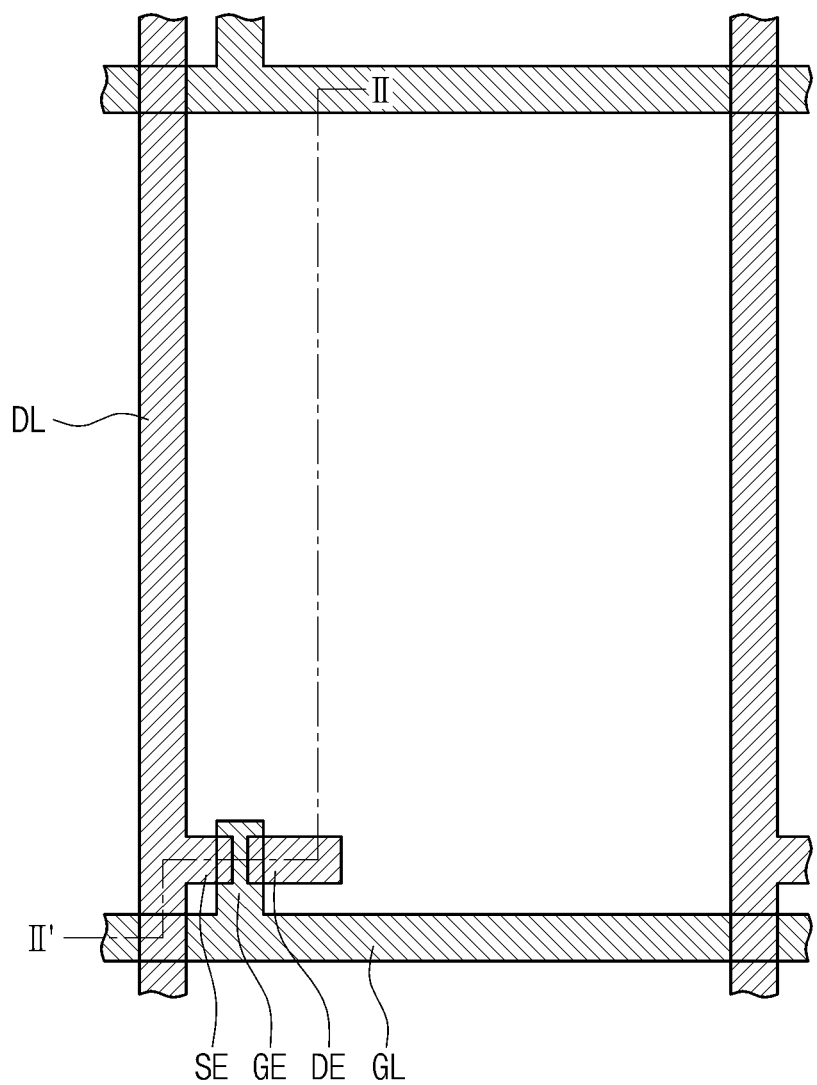
Figure 9:
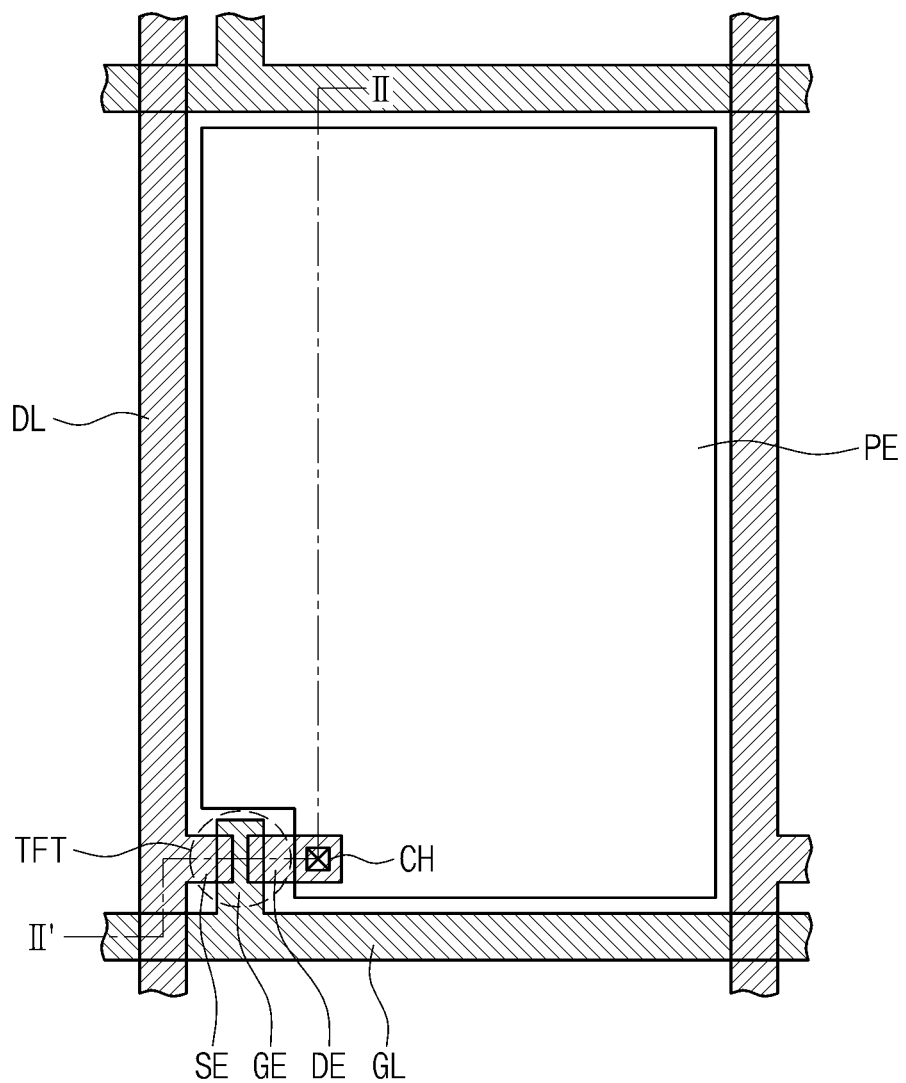

FIGS. 5, 7 and 9 are plan views subsequently illustrating a method of manufacturing a display apparatus in accordance with an exemplary embodiment of the invention.

FIGS. 6A and 6B are cross-sectional views taken along line II-II' in FIG. 5, FIGS. 8A and 8B are cross-sectional views taken along line II-II' in FIG. 7, and FIGS. 10A and 10B are cross-sectional views taken along line II-II' in FIG. 9. In this case, when the display apparatus is completed, FIGS. 6A, 6B, 8A, 8B, 10A and 10B are illustrated so that an image provided direction facing a user, may direct toward a lower portion.

Referring to FIGS. 5 and 6A, a first insulating substrate INS1 is prepared first, and a low reflection layer LRL is disposed on the first insulating substrate INS1. In the first insulating substrate INS1, when a side displaying an image is called referred to a front surface FSF, and an opposite side thereof is referred to a rear surface RSF, the low reflection layer LRL may be disposed on the rear surface RSF.

The low reflection layer LRL may be provided by means of a photolithography process. That is, the low reflection layer LRL may be provided by coating a photosensitive polymer resin composition on the first insulating substrate INS1, exposing the photosensitive polymer resin composition to light by using a mask, and developing the photosensitive polymer resin composition.

In an exemplary embodiment, the photosensitive resin composition may be coated by using a roll coater, a curtain coater, a spin coater, a slot die coater, various printing methods, precipitations, or the like. In addition, the photosensitive resin composition may be coated on a supporter such as a film, and then transferred onto the first insulating substrate INS1. However, the method is not limited thereto.

The light exposed to the photosensitive resin composition may be ultraviolet light, but is not limited thereto.

The photosensitive resin composition may include a binder resin, a cross-linkable compound including at least two ethylenically unsaturated bonds, a photopolymerizable initiator or a pigment and a solvent. In the photosensitive resin composition, various additives improving layer having properties or adhesiveness with a substrate may be further included.

The binder resin may have a structure including a carbonic acid group, a carboxylic anhydride group, a hydroxyl group, an amino group or an amide group, and may use a homopolymer or a copolymer of a novolak phenol resin or an acryl resin. As the acryl binder resin which may be developed by an alkaline solution, a copolymer using at least one compound selected from maleic anhydride, acrylic acid or methacrylic acid or an alkyl ester thereof, a substituted or unsubstituted aryl ester, an aromatic vinyl monomer, and the like. Particularly, a copolymer of benzyl acrylate, benzyl methacrylate, phenylethyl acrylate, phenylethyl methacrylate, 3-phenylpropyl acrylate, 3-phenylpropyl methacrylate, 4-phenylbutyl acrylate, 4-phenylbutyl methacrylate, acrylic acid, methacrylic acid, and the like, may be included.

The cross-linkable compound including the ethylenically unsaturated bond may include at least one of a compound obtained by conducting an esterification of a polyhydric alcohol with α,β-unsaturated carboxylic acid, the polyhydric alcohol being at least one of ethylene glycol di(meth)acrylate, polyethylene glycol di(meth)acrylate having 2 to 14 ethylene groups, trimethylolpropane di(meth)acrylate, trimethylolpropane tri(meth)acrylate, pentaerythritol tri(meth)acrylate, pentaerythritol tetra(meth)acrylate, polypropylene glycol di(meth)acrylate having 2 to 14 propylene groups, dipentaerythritol penta(meth)acrylate, dipentaerythritol hexa(meth)acrylate, etc.; a compound obtained by adding (meth)acrylic acid to a compound including a glycidyl group such as, for example, a trimethylolpropane triglycidyl ether acrylate addition product, or a bisphenyl A diglycidyl ether acrylate addition product, etc.; an ester compound formed by a compound including a hydroxyl group or an ethylenically unsaturated bond and a polyhydric carboxylic acid, or an addition product of polyisocyanate, such as a diester phthalate of β-hydroxyethyl(meth)acrylate, or a toluene diisocyanate addition product of β-hydroxyethyl(meth)acrylate, etc.; and an alkylester(meth)acrylate such as methyl(meth)acrylate, ethyl(meth)acrylate, butyl(meth)acrylate, 2-ethylhexyl (meth)acrylate, etc., or any combinations thereof. However, the compound may not be limited to the above-described kinds, and known compounds in this field may be used.

The photopolymerizable initiator includes at least of a triazine compound such as 2,4-trichloromethyl-(4'-methoxyphenyl)-6-triazine, 2,4-trichloromethyl-(4'-methoxystyryl)-6-triazine, 2,4-trichloromethyl-(perfluonyl)-6-triazine, 2,4-trichloromethyl-(3',4'-dimethoxyphenyl)-6-triazine, 3-{4-[2,4-bis(trichloromethyl)-s-triazine-6-yl] phenylthio}pronanic acid, etc.; a biimidazole compound such as 2,2'-bis(2-chlorophenyl)-4,4',5,5'-tetraphenyl biimidazole, 2,2'-bis(2,3-dichlorophenyl)-4,4',5,5'-tetraphenylbiimidazole, etc.; an acetophenone-based compound such as 2-hydroxy-2-methyl-1-phenylpropane-1-on, 1-(4-isopropylphenyl)-2-hydroxy-2-methylpropane-1-on, 4-(2-hydroxyethoxy)-phenyl(2-hydroxy)propyl ketone, 1-hydroxycyclohexyl phenyl ketone, benzoin methyl ether, benzoin ethyl ether, benzoin isobutyl ether, benzoin butyl ether, 2,2-dimethoxy-2-phenyl acetophenone, 2-methyl-(4-methylthiophenyl)-2-morpholino-1-propane-1-on, 2-benzyl-2-dimethylamino-1-(4-morpholinophenyl)-butane-1-on, etc.; a benzophenone-based compound such as benzophenone, 4,4'-bis(dimethylamino)benzophenone, 4,4'-bis(diethylamino)benzophenone, 2,4,6-trimethylaminobenzophenone, methyl-o-benzoyl benzoate, 3,3-dimethyl-4-methoxybenzophenone, 3,3',4,4'-tetra(t-butylperoxycarbonyl)benzophenolen, etc.; a fluorenone-based compound such as 9-fluorenone, 2-chloro-9-fluorenone, 2-methyl-9-fluorenone, etc.; a thioxanthone-based compound such as thioxanthone, 2,4-diethyl thioxanthone, 2-chloro thioxanthone, 1-chloro-4-propyloxy thioxanthone, isopropyl thioxanthone, diisopropyl thioxanthone, etc.; a xanthone-based compound such as xanthone, 2-methyl xanthone, etc.; an anthraquinone-based compound such as anthraquinone, 2-methyl anthraquinone, 2-ethyl anthraquinone, t-butyl anthraquinone, 2,6-dichloro-9,10-anthraquinone, etc.; an acridine-based compound such as 9-phenylacridine, 1,7-bis(9-acridinyl)heptane, 1,5-bis(9-acridinyl)pentane, 1,3-bis(9-acrydinyl)propane, etc.; a dicarbonyl compound such as benzyl 1,7,7-trimethyl-bicyclo[2,2,1]heptane-2,3-dione, 9,10-phenanthrenequinone, etc.; a phosphine oxide-based compound such as 2,4,6-trimethylbenzoyl diphenylphosphine oxide, bis(2,6-dimethoxybenzoyl)-2,4,4-trimethylpentyl phosphine oxide, bis(2,6-dichlorobenzoyl) propyl phosphine oxide, etc.; an amine-based synergist such as methyl 4-(dimethylamino)benzoate, ethyl-4-(dimethylamino)benzoate, 2-n-butoxyethyl 4-(dimethylamino)benzoate, 2,5-bis(4-diethylaminobenzyl)cyclopentanone, 2,6-bis(4-diethylaminobenzal)cyclohexanone, 2,6-bis(4-diethylaminobenzyl)-4-methyl-cychlohexanone, etc.; a coumarin-based compound such as 3,3'-carbonylvinyl-7-(diethylamino)coumarin, 3-(2-benzothiazolyl)-7-(diethylamino)coumarin, 3-benzoyl-7-(diethylamino)coumarin, 3-benzoyl-7-methoxy-coumarin, 10,10'-carbonylbis[1,1,7,7-tetramethyl-2,3,6,7-tetrahydro-1H,5H,11H—Cl]-benzopyrano[6,7,8-ij]-quinolizine-11-one, etc.; a chalcone compound such as 4-diethylamino chalcone, 4-azide benzyl acetophenone, etc.; 2-benzoylmethylene and 3-methyl-β-naphthothiazoline, or any combinations thereof. However, the compounds are not limited thereto, and known photoinitiators in this art may be used.

The pigment illustrates black color and may include a metal oxide such as carbon black, graphite or titanium black. The carbon black may include at least one of Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, Cisto VGPF, Cisto SVHSRF-HS and Cisto SSRF (Donghae Carbon Co., Ltd.); Diagram black II, Diagram black N339, Diagram black SH, Diagram black H, Diagram LH, Diagram HA, Diagram SF, Diagram N550M, Diagram M, Diagram E, Diagram G, Diagram R, Diagram N760M, Diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, 0IL7B, 0IL9B, 0IL11B, 0IL30B and 0IL31B (Mitsubishi Chemical Co., Ltd.); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa Co., Ltd.); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, RAVEN-1170 (Columbia Carbon Co., Ltd.), or a mixture thereof. A phthalocyanine-based complex compound used as the pigment may be a material including zinc as a central metal instead of copper.

The solvent may be at least one selected from acetone, methyl ethyl ketone, methyl isobutyl ketone, methylcelllosolve, ethylcellosolve, tetrahydrofurane, 1,4-dioxane, ethyleneglycol dimethyl ether, ethyleneglycol diethyl ether, propyleneglycol dimethyl ether, propyleneglycol diethyl ether, diethyleneglycol dimethyl ether, diethyleneglycol diethyl ether, diethyleneglycol methyl ethyl ether, chloroform, methylene chloride, 1,2-dichloroethane, 1,1,1-trichloroethane, 1,1,2-trichloroethane, 1,1,2-trichloroethene, hexane, heptane, octane, cyclohexane, benzene, toluene, xylene, methanol, ethanol, isopropanol, propanol, butanol, t-butanol, 2-ethoxy propanol, 2-methoxy propanol, 3-methoxy butanol, cyclohexanone, cyclopentanone, propyleneglycol methyl ether acetate, propyleneglycol ethyl ether acetate, 3-methoxybutyl acetate, ethyl 3-ethoxy propionate, ethyl cellosolveacetate, methyl cellosolveacetate, butyl acetate and dipropyleneglycol monomethyl ether, etc., or any combinations thereof. However, the solvent may not be limited to the above-described compounds and known solvents in the art may be used.

The photosensitive resin composition in accordance with the invention may further include at least one selected from a curing accelerator, an inhibitor of thermal polymerization inhibitor, a surfactant, a photosensitizer, a plasticizer, an adhesion promoter, a filler and an adhesion auxiliary agent according to the use of the photosensitive resin composition.

The curing accelerator may include at least one of, for example, 2-mercaptobenzoimidazole, 2-mercaptobenzothiazole, 2-mercaptobenzoxazole, 2,5-dimercapto-1,3,4-thiadiazole, 2-mercapto-4,6-dimethylaminopyridine, pentaerythritol tetrakis(3-mercaptopropionate), pentaerythritol tris(3-mercaptopropionate), pentaerythritol tetrakis(2-mercaptoacetate), pentaerythritol tris(2-mercaptoacetate), trimethylolpropane tris(2-mercaptoacetate), trimethylolpropane tris(3-mercaptopropionate), trimethylolethane tris(2-mercaptoacetate) and trimethylolethane tris(3-mercaptopropionate). However, the curing accelerator may include commonly known materials in this field without limitation.

The thermal polymerization inhibitor may include at least one of p-anisole, hydroquinone, pyrocatechol, t-butyl catechol, N-nitirosophenylhydorxyamine ammonium salts, N-nitrosophenylhydroxylamine aluminum salts, and phenothiazine. However, the inhibitor may not be limited thereto, and may include commonly known materials in this art.

The surfactant, the photosensitizer, the plasticizer, the adhesion promoter, the filler, etc. may include all kinds of materials commonly included in a common photosensitive resin composition.

Referring to FIGS. 5 and 6B, a gate wiring part is disposed on the low reflection layer LRL.

The gate wiring part may be provided by using a photolithography process. That is, the gate wiring part may be provided by disposing a conductive layer on the low reflection layer LRL, disposing a photoresist on the conductive layer, exposing and developing the photoresist using a mask to provide a photoresist pattern and etching the conductive layer by using the photoresist pattern as an etching mask.

In this case, the gate wiring part may be provided to have the same shape at the same region as the low reflection layer LRL. The gate wiring part may be provided to have the same size (the same width or the same area) as that of the low reflection layer LRL, or may be provided to have a greater size than that of the low reflection layer LRL. In the former case, the mask used for providing the low reflection layer LRL and the mask used for providing the data wiring part may be the same. In the latter case, the mask used for providing the low reflection layer LRL and the mask used for providing the data wiring part may be the same or different. When the masks are the same, the conditions of exposing and developing may be controlled.

On the gate wiring part, a gate insulating layer GI is disposed.

Then, a date wiring part is disposed on the gate insulating layer GI as illustrated in FIGS. 7, 8A and 8B.

The data wiring part is provided by a photolithography process. First, as illustrated in FIG. 8A, a semiconductor thin film SM1, a conductive layer CL and a photoresist PR are provided one by one on the gate insulating layer GI. The photoresist PR is exposed through a mask MSK. The mask MSK is a half-tone mask, and may include three regions R1, R2 and R3 having different transmittance. According to the region, the amount of light irradiated onto the photoresist PR may be changed. When the photoresist PR is developed, a photoresist pattern having different heights corresponding to each region may be provided.

The semiconductor thin film SM1 and the conductive layer CL are selectively etched by using the photoresist pattern to provide a data wiring part as illustrated in FIG. 8B.

Referring to FIGS. 9, 10A and 10B, a passivation layer PSV is disposed on the data wiring part, and a contact hole CH exposing a portion of the drain electrode DE is defined in the passivation layer PSV. The contact hole CH may be defined by using a photolithography process. Then, a pixel electrode PE connected to the drain electrode DE through the contact hole CH is defined on the passivation layer PSV. The pixel electrode PE may be provided by using a photolithography process.

Even though not illustrated, a color filter, a black matrix and a common electrode are disposed on a second insulating substrate separately from the first insulating substrate INS1 in accordance with an exemplary embodiment of the invention. In another exemplary embodiment, the common electrode may be disposed on the first insulating substrate INS1 and may be insulated from the pixel electrode PE.

A liquid crystal layer is disposed between the first insulating substrate INS1 and the second insulating substrate. The image display layer may be replaced with an electrophoretic layer, an electrowetting layer, or the like according to a kind of the display apparatus.

Finally, a backlight unit is provided at a facing position to the first insulating substrate INS1 with placing the second insulating substrate therebetween.

In the display apparatus in accordance with an exemplary embodiment of the invention, the first substrate provided with thin film transistors may be positioned further from the backlight unit than the second substrate. Thus, the deterioration of the thin film transistors by light continuously provided from the backlight unit may be effectively decreased or prevented. As illustrated in FIG. 2, since the first substrate is provided to have a greater size than the second substrate, a space for disposing a tape carrier package connected to the first substrate may be provided under the first substrate. The tape carrier package may be disposed in the space, and so, a driving circuit (e.g., a driver IC) may be stably installed on the tape carrier package.

According to an exemplary embodiment of the invention, a low reflection layer is provided on the rear surface of the first insulating substrate, and the reflection of external light by the gate wiring part may be effectively decreased or prevented.

That is, when a user watches the display panel, light reflected from the gate wiring part closest to the user may be recognized through the front surface of the first insulating substrate. Thus, a contrast ratio of the image may be decreased.

Through providing the low reflection layer, the light from the exterior may be absorbed by the low reflection layer. Thus, the reflected light at the gate wiring part may be effectively removed or decreased. Accordingly, the contrast ratio of the image may be maintained.

Figure 11:
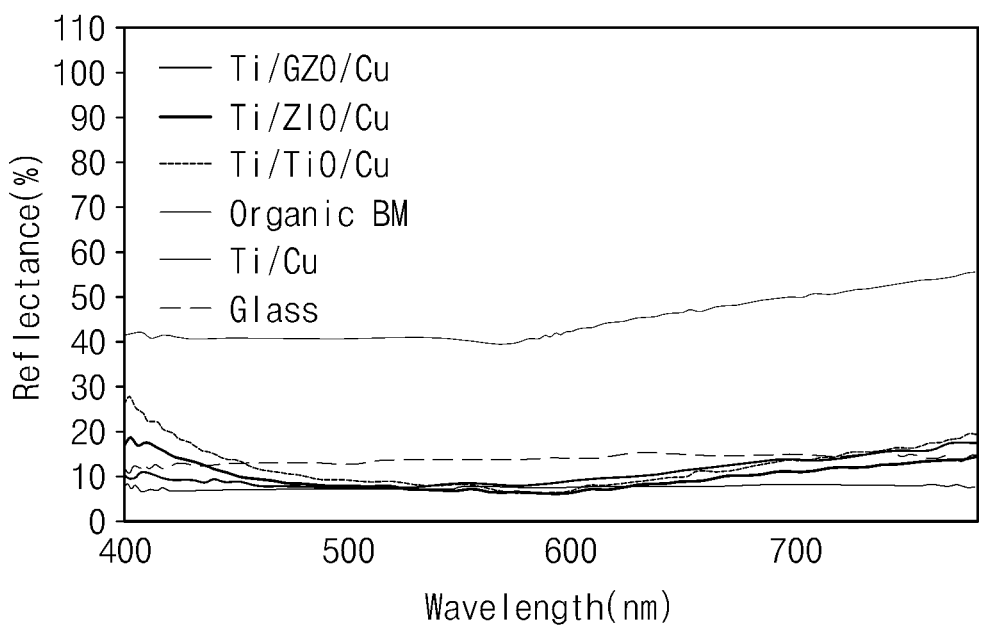
FIG. 11 is a graph illustrating a reflectance rate (percent) of each material versus a wavelength of light (nanometer) when providing a thin film using various materials.

FIG. 11 illustrates a graph illustrating a reflectance rate in percent (%) of each material according to a wavelength of light in nanometers (nm) when providing a thin film using various materials. In Table 1, the reflectance in FIG. 11 is illustrated as a numerical value. An organic polymer in FIG. 11 and Table 1 is a polymer resin. A polymer resin (CR-BK0955L) of Cheil Industries Inc. was used. When different materials were used in a multi-layer, slash (/) was used. Specifically, "A/B" means a double layer including A and B materials and "A/B/C" means a triple layer including A, B and C materials, for example.

TABLE 1

| Materials | Reflectance | | | |
|---|---|---|---|---|
| | Average (%) | 450 nm (%) | 550 nm (%) | 650 nm (%) |
| Ti/GZO/Cu | 10.51 | 8.42 | 8.08 | 11.05 |
| Ti/ZIO/Cu | 9.85 | 10.27 | 7.29 | 8.87 |
| Ti/TiO/Cu | 11.91 | 13.02 | 7.80 | 10.04 |
| Polymer resin | 7.22 | 6.88 | 7.01 | 7.36 |
| Glass | 13.61 | 12.30 | 7.01 | 14.58 |
| Ti/Cu | 44.53 | 40.54 | 39.99 | 46.40 |

Referring to FIG. 11 and Table 1, the reflectance of a thin film provided by using the polymer resin is very low when compared with metal, or a multi-layer of the metal and a metal oxide. Particularly, an average reflectance of a titanium/copper double layer, which has been used as materials of a wiring in a common display apparatus, was up to 44.53%, however an average reflectance of the polymer resin was only 7.22%. Thus, the average reflectance of the wiring part may be remarkably decreased by providing the low reflection layer using the polymer resin in accordance with an exemplary embodiment.

Figure 12:
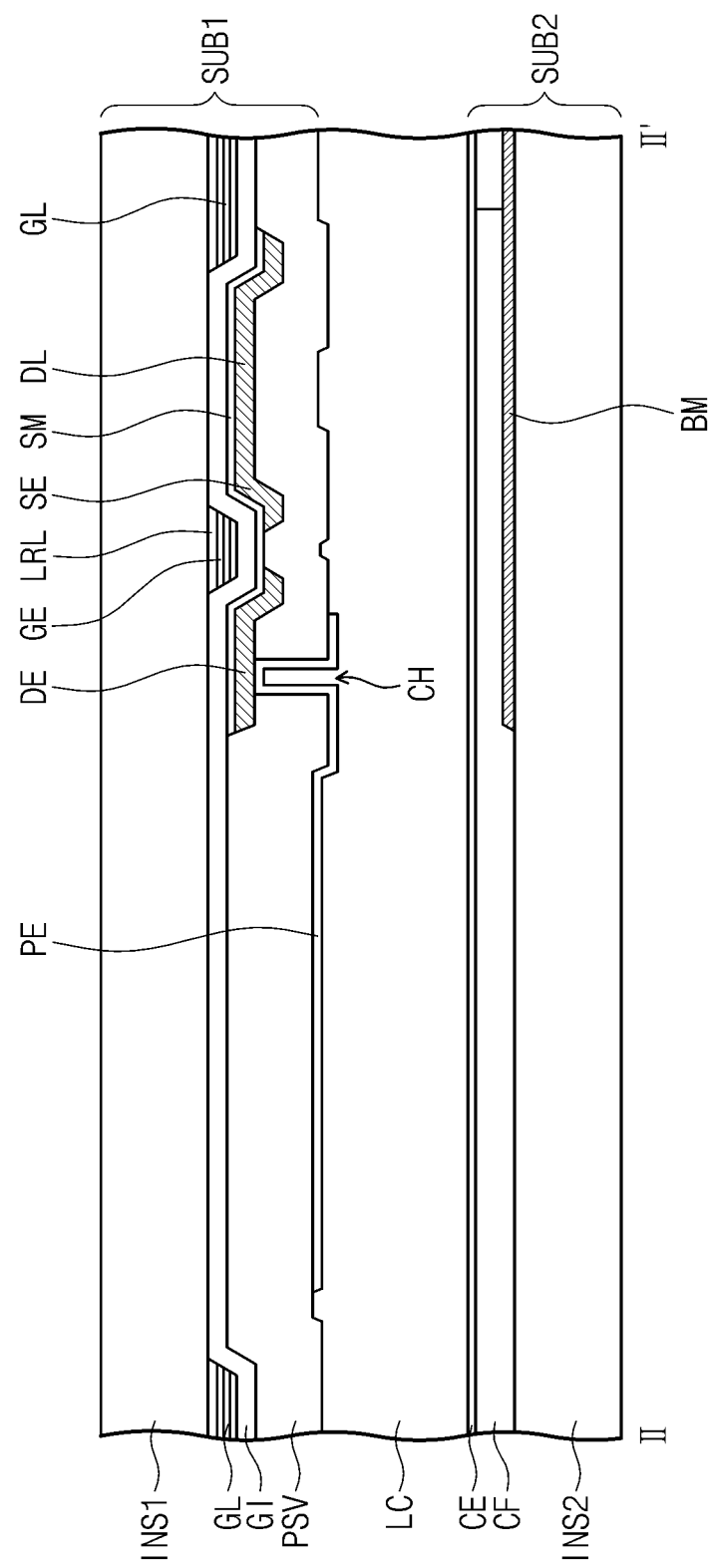
FIG. 12 is a cross-sectional view illustrating another exemplary embodiment of a display apparatus in accordance with the invention.

FIG. 12 is a cross-sectional view illustrating a display apparatus in accordance with another exemplary embodiment of the invention and corresponds to a cross-sectional view taken along line II-II' in FIG. 3. In the display apparatus in accordance with another exemplary embodiment, different parts will be mainly explained for convenience of explanation, and omitted parts will follow the above-described exemplary embodiment.

Referring to FIG. 12, the gate wiring part is provided as a multi-layer. Particularly, the gate wiring part is provided as a triple-layer including first to third metal layers.

The first to third metal layers may include different conductive materials. In an exemplary embodiment, the first to third metal layers may include metal/metal oxide/metal one by one. In accordance with an exemplary embodiment of the invention, the first metal layer may be provided using Ti, the second metal layer may be provided using one of gallium zinc oxide ("GZO"), zinc indium oxide ("ZIO") and TiO, and the third metal layer may be provided using copper (Cu).

As shown in Table 1, when the first to third metal layers include Ti/GZO/Cu, Ti/ZIO/Cu, or Ti/TiO/Cu, a remarkably decreased reflectance was obtained when compared with the double-layer including titanium/copper, i.e., the common materials of the wiring in a common display apparatus. Thus, the reflectance may be even further decreased by combining the low reflection layer and the wiring materials having low reflectance.

Figure 13:
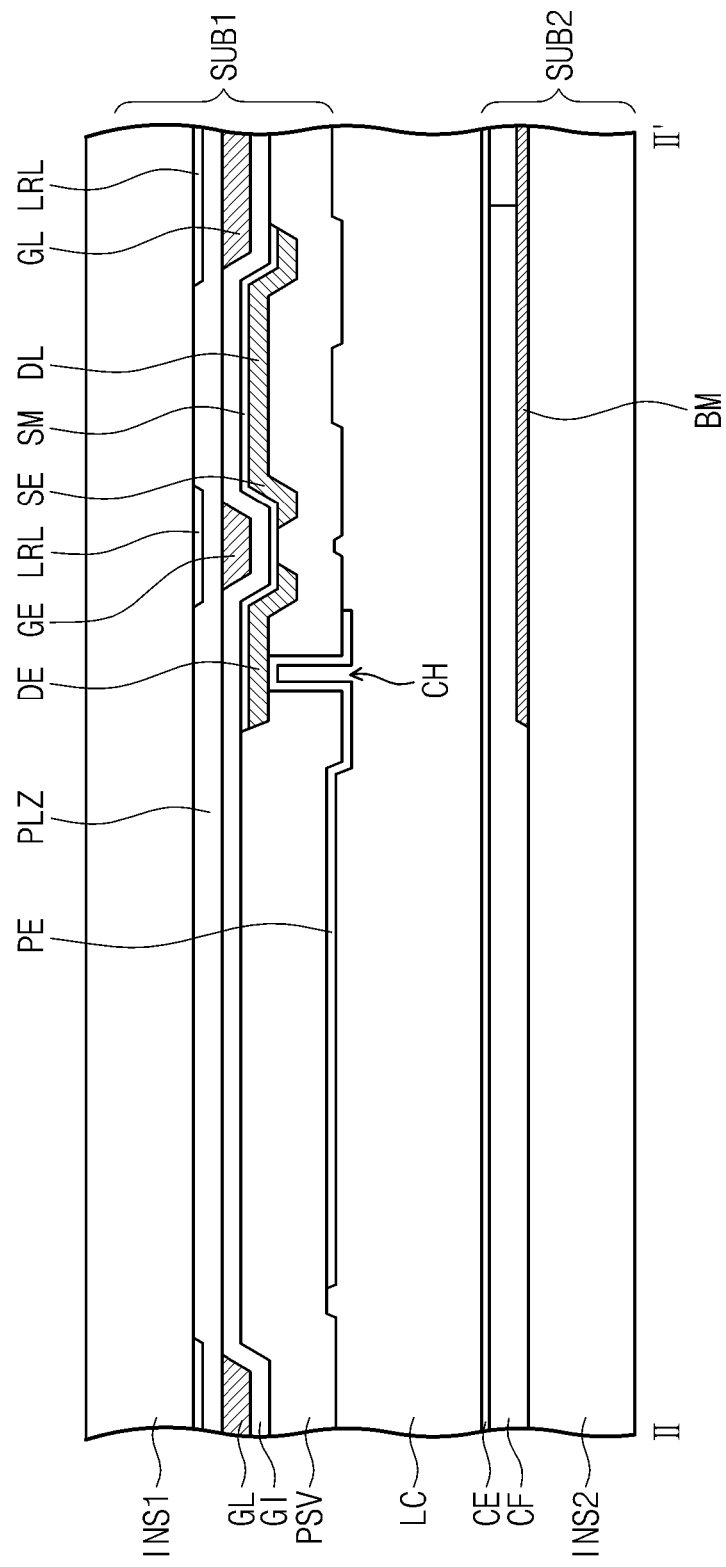
FIG. 13 is a cross-sectional view illustrating another exemplary embodiment of a display apparatus in accordance with the invention.

FIG. 13 is a cross-sectional view illustrating a display apparatus in accordance with another exemplary embodiment of the invention, and corresponds to a cross-sectional view taken along line II-II'.

Referring to FIG. 13, a planarization layer PLZ is provided between the low reflection layer LRL and the gate wiring part. The planarization layer PLZ is provided to planarize a crooked portion due to the low reflection layer LRL and is provided by using an inorganic insulating material. In an exemplary embodiment, the inorganic insulating material may be silicon oxide and/or silicon nitride.

The display apparatus in accordance with an exemplary embodiment may be manufactured by providing a low reflection layer, providing a planarization layer on the low reflection layer by a chemical vapor deposition method and disposing a gate wiring part on the planarization layer by using a photolithography process.

The above-disclosed subject matter is to be considered illustrative and not restrictive, and the appended claims are intended to cover all such modifications, enhancements and other exemplary embodiments, which fall within the true spirit and scope of the invention.

In an exemplary embodiment, the gate wiring part is disposed closer to the rear surface of the first insulating substrate than the data wiring part, and the low reflection layer is provided to overlap the gate wiring part, for example. However, the invention is not limited thereto. When the data wiring part is disposed closer to the rear surface of the first insulating substrate than the gate wiring part, the low reflection layer may be provided to overlap the data wiring part.

In addition, to the maximum extent allowed by law, the scope of the invention is to be determined by the broadest permissible interpretation of the following claims and their equivalents, and shall not be restricted or limited by the foregoing detailed description.

What is claimed is:

1. A display apparatus comprising:
a first insulating substrate comprising a front surface which provides an image and a rear surface opposite to the front surface;
a low reflection layer provided on the rear surface;
a gate wiring part provided on the low reflection layer;
a data wiring part provided on the rear surface, and insulated from the gate wiring part; and
a pixel which is connected to the data wiring part and displays the image,
wherein the low reflection layer comprises a polymer resin which has a black color,
wherein the pixel comprises a pixel electrode connected to the data wiring part and a common electrode, and
wherein the low reflection layer is disposed on a same substrate which the pixel electrode is disposed on.

2. The display apparatus of claim 1, wherein:
the low reflection layer is provided at a same position with a same shape as the gate wiring part from a plan view, and
a width of the low reflection layer is equal to or smaller than a width of the gate wiring part.

3. The display apparatus of claim 2, wherein:
the gate wiring part comprises a gate line extended in a first direction, and a gate electrode connected to the gate line, and the data wiring part comprises a data line extended in a second direction different from the first direction, a source electrode connected to the data line, and a drain electrode separated from the source electrode.

4. The display apparatus of claim 3, wherein the gate wiring part further comprises a single layer structure.

5. The display apparatus of claim 4, wherein the gate wiring part comprises one of copper, titanium, molybdenum, chromium, gold, silver and an alloy including at least one of copper, titanium, molybdenum, chromium, gold and silver.

6. The display apparatus of claim 3, wherein the gate wiring part further comprises a multi-layer structure.

7. The display apparatus of claim 6, wherein the multi-layer structure includes first to third metal layers sequentially stacked and comprising different materials, on the rear surface.

8. The display apparatus of claim 7, wherein the first metal layer comprises Ti, the second metal layer comprises one of GZO, ZIO and TiO and the third metal layer comprises Cu.

9. The display apparatus of claim 1, further comprising a planarization layer between the gate wiring part and the low reflection layer.

10. The display apparatus of claim 1, further comprising a second insulating substrate facing the first insulating substrate, wherein:
the pixel further comprises an image display layer provided between the first insulating substrate and the second insulating substrate, and driven by the electric field, and
wherein the common electrode which is provided on one of the first insulating substrate and the second insulating substrate, insulated from the pixel electrode, and generates an electric field together with the pixel electrode.

11. The display apparatus of claim 10, wherein the image display layer is one of a liquid crystal layer, an electrophoretic layer and an electrowetting layer.

12. The display apparatus of claim 11, further comprising a backlight unit which provides light to the image display layer, and faces the first insulating substrate,
wherein the second insulating substrate is interposed between the backlight unit and the first insulating substrate.

13. The display apparatus of claim 2, wherein the gate wiring part covers side portions of the low reflection layer.

14. A display apparatus comprising:
a first insulating substrate comprising a front surface which provides an image and a rear surface opposite to the front surface;
a plurality of gate wiring parts provided on the rear surface, the gate wiring parts arranged along a first direction;
a low reflection layer provided between the rear surface and the gate wiring parts;
a plurality of data wiring parts which are provided on the rear surface, insulated from the gate wiring parts, and the data wiring parts arranged in a second direction crossing the first direction; and
a plurality of pixels which are respectively connected to the data wiring parts and display the image,
wherein the low reflection layer overlaps an entirety of the gate wiring parts,
wherein the low reflection layer has black color and includes hydrocarbon and a siloxane.

\* \* \* \* \*